United States Patent [19]

Kaibara et al.

[11] Patent Number: 5,285,069
[45] Date of Patent: Feb. 8, 1994

[54] ARRAY OF FIELD EFFECT TRANSISTORS OF DIFFERENT THRESHOLD VOLTAGES IN SAME SEMICONDUCTOR INTEGRATED CIRCUIT

[75] Inventors: Mitsuo Kaibara, Minoo; Hiizu Okubo, Nishinomiya; Takako Maruyama, Ikeda; Seiji Yamanaka, Minoo; Hideyuki Aota, Toyonaka, all of Japan

[73] Assignee: Ricoh Company, Ltd., Tokyo, Japan

[21] Appl. No.: 795,834

[22] Filed: Nov. 21, 1991

[30] Foreign Application Priority Data

| Nov. 21, 1990 | [JP] | Japan | 2-319375 |
| Jun. 14, 1991 | [JP] | Japan | 3-170633 |
| Sep. 18, 1991 | [JP] | Japan | 3-268370 |

[51] Int. Cl.$^5$ ............ H01L 29/76; H01L 27/10; H01L 23/62; H01L 27/11
[52] U.S. Cl. ............... 257/392; 257/208; 257/360; 257/404; 257/903
[58] Field of Search ........ 357/23.1, 23.12, 23.13, 357/45, 47, 48, 53; 257/203, 204, 206, 208, 357, 360, 369, 391, 392, 393, 402, 404, 903, 904, 390, 544

[56] References Cited

U.S. PATENT DOCUMENTS

| 3,470,390 | 9/1969 | Lin | 357/23.13 |
| 4,395,725 | 7/1983 | Parekh | 357/23.12 |
| 4,472,871 | 9/1984 | Green et al. | 357/23.12 |
| 4,575,743 | 3/1986 | Hashimoto | 357/23.12 |
| 4,600,933 | 7/1986 | Richman | 357/23.12 |
| 4,814,839 | 3/1989 | Nishizawa et al. | 357/23.12 |
| 5,067,000 | 11/1991 | Eimori et al. | 357/47 |
| 5,083,178 | 1/1992 | Otsu | 357/45 |

FOREIGN PATENT DOCUMENTS

| 60-163458 | 8/1985 | Japan | 357/47 |
| 61-164265 | 7/1986 | Japan | 357/47 |
| 2-17875 | 4/1990 | Japan . | |
| 2-30118 | 7/1990 | Japan . | |
| 2-250351 | 10/1990 | Japan | 357/47 |
| 2-264465 | 10/1990 | Japan | 357/47 |
| 2-264466 | 10/1990 | Japan | 357/47 |

*Primary Examiner*—William Mintel
*Assistant Examiner*—Steven Loke
*Attorney, Agent, or Firm*—Cooper & Dunham

[57] ABSTRACT

A semiconductor integrated circuit apparatus has a basic cell region formed by arranging a plurality of basic cells each including a MOS transistor in longitudinal and transversal directions. The MOS transistor has source-drain section diffusive regions formed on a semiconductor substrate, and a gate electrode formed on a channel region between these source-drain section diffusive regions through a gate insulating film. One portion or all of the channel region of at least one MOS transistor within the basic cell region has an impurity concentration different from that in the channel region of another MOS transistor of the same conductivity type within the same basic cell. For example, a threshold voltage in the channel region of a MOS transistor is increased until about 6 volts by implanting ions into the channel region. No MOS transistor is operated at a power voltage such as 5 volts and separates MOS transistors on both sides thereof from each other. Wiring is formed on the MOS transistor and the gate electrode is used as the wiring, thereby improving wiring efficiency.

16 Claims, 15 Drawing Sheets

P/N = 3/1

P/N = 3/1

ARRAY OF FIELD EFFECT TRANSISTORS OF DIFFERENT THRESHOLD VOLTAGES IN SAME SEMICONDUCTOR INTEGRATED CIRCUIT

BACKGROUND OF THE INVENTION

1. Field of the Invention

The present invention relates to a semiconductor integrated circuit apparatus of a master slice type in which a plurality of basic cells including MOS transistors are regularly arranged. More particularly, the present invention relates to a semiconductor integrated circuit apparatus of a master slice type which is of a CMOS type of BiCMOS type and includes a MOS gate array and a MOS-composite gate array (which constitutes a semiconductor integrated circuit apparatus having a gate array structure in one portion of a semiconductor chip), or a MOS transistor of a P-channel type (which is called a PMOS transistor in the following description) and a MOS transistor of an N-channel type (which is called an NMOS transistor in the following description) in a basic cell. The present invention also relates to a method for manufacturing the semiconductor integrated circuit apparatus.

2. Description of the Related Art

A field insulating film is used as a first example to separate electric elements from each other in a MOS transistor. In a second example, a turning-off MOS transistor having a gate electrode connected to a power source is used to separate electric elements from each other in a MOS transistor.

For example, basic gates separated from each other by the field insulating film have generally two inputs. Accordingly, when a circuit structure is constructed such that the basic gates have three or five inputs, there are unused gate electrodes so that flexibility with respect to the number of input signals is low.

In an element separating region, it is necessary to dispose a region for connecting a gate electrode to power source wiring, thereby reducing wiring efficiency. Further, it is impossible to use this gate electrode in wiring so that the wiring efficiency is further reduced.

A general surge protecting element is constructed by a MOS transistor equal to that constituting an internal logic circuit. Accordingly, no drain withstand voltage of the protecting element is reduced by taking various kinds of measures for securing reliability of the MOS transistor. Therefore, a gate withstand voltage is set to be lower than the drain withstand voltage of the protecting element as a size of the protecting element is reduced. In such a reversing phenomenon, such a protecting element cannot function as a normal protecting element.

In a general diode having a PN-junction, a backward withstand voltage depends on temperature so that this diode cannot be used as a constant voltage circuit.

When a logic circuit is constructed by using a general CMOS-type master slice and its logic threshold voltage is changed, it is necessary to dispose plural PMOS and NMOS transistors. Therefore, an area for these MOS transistors is increased on a master slice chip.

Further, the number of used PMOS transistors is not necessarily in conformity with the number of used NMOS transistors. Accordingly, some MOS transistors are unused and the size of a circuit structure is increased.

As mentioned above, each of the PMOS and NMOS transistors included in a basic cell has a constant size. Accordingly, this size is larger than the size of a minimum transistor required to flow a required electric current therethrough so that a direct electric current excessively flows through the MOS transistors.

In a semiconductor integrated circuit apparatus of a master slice type, each of the PMOS and NMOS transistors is set to have an intrinsic channel width. Therefore, if a memory cell is formed in the semiconductor integrated circuit apparatus of a master slice type, the number of used gates is increased and an area for the memory cell is increased.

In another proposed method, a basic unit of the semiconductor integrated circuit apparatus of a master slice type is set by adding PMOS and NMOS transistors and an NMOS transistor of a size smaller than that of each of the PMOS and NMOS transistors to a basic unit cell. When a memory is constructed, the small-sized NMOS transistor is used as an access gate. For example, such a method is shown in "Monthly Semiconductor World" published in February in 1990, pp. 92 to 95. However, in this method, an area for the basic unit cell is increased by adding the small-sized NMOS transistor to this basic unit cell.

In a static RAM, complementary signals on are generally required in a writing operation. To provide a SRAM of high density, there is a method for reducing the number of data lines (bit lines) and the number of MOS transistors by setting each of the complementary signals in the writing operation to a single signal. However, it is necessary to insert an inverter between an access gate and a latch section so as to prevent read data from being fed back to a memory cell. Therefore, it is impossible to provide the SRAM of high density in a semiconductor integrated circuit of a master slice type.

Further, there is another SRAM in which an initial state of the memory cell can be set to prevent this initial state from being undefined when a power source is turned on. The initial state of the memory cell is set by changing operating characteristics thereof as one example of the SRAM. In this example, the size of a MOS transistor constituting the memory cell is changed by changing the width of a diffusive layer of the MOS transistor. The initial state of the memory cell is set by arbitrarily setting the operating characteristics of the memory cell. There is another memory cell for setting the initial state by changing memory cell circuits. For example, such a structure is shown in Japanese Patent Publication (KOKOKU) Nos. 2-30118 and 2-17875.

However, no method for changing the width of the diffusive layer to change the operating characteristics of the memory cell can be applied to the semiconductor integrated circuit apparatus of a master slice type. Further, in the method for changing electric circuits of the memory cell, the electric circuits must be changed in accordance with a set value of the memory cell.

SUMMARY OF THE INVENTION

It is therefore a first object of the present invention to provide a semiconductor integrated circuit apparatus for reducing an area for element separation.

A second object of the present invention is to provide a semiconductor integrated circuit apparatus for separating electric elements from each other with high circuit flexibility.

A third object of the present invention is to provide a semiconductor integrated circuit apparatus in which a protecting element has a drain withstand voltage lower than a gate withstand voltage of an internal circuit.

A fourth object of the present invention is to provide a semiconductor integrated circuit apparatus in which no operation of a constant voltage circuit is changed so much by a change in temperature.

A fifth object of the present invention is to provide a semiconductor integrated circuit apparatus in which the logic threshold voltage of a logic circuit can be arbitrarily set without using many basic cells and the size of a circuit structure can be reduced by effectively using MOS transistors and power consumption can be reduced without excessively flowing a direct electric current through the MOS transistors.

A sixth object of the present invention is to provide a high speed memory having no error in operation without increasing the number of used gates.

A seventh object of the present invention is to provide a SRAM in which a writing operation of the SRAM can be performed with respect to a single signal so as to provide a master slice type semiconductor integrated circuit of high density.

An eighth object of the present invention is to provide a static RAM in which this static RAM is used in a semiconductor integrated circuit apparatus of a master slice type and can set an initial state of a memory cell by changing operating characteristics thereof when a power source is turned on.

In accordance with a first structure of the present invention, the above first object can be achieved by a semiconductor integrated circuit apparatus comprising a basic cell region formed by arranging a plurality of basic cells each including a MOS transistor in longitudinal and transversal directions; the MOS transistor having source-drain section diffusive regions formed on a semiconductor substrate, and a gate electrode formed on a channel region between these source-drain section diffusive regions through a gate insulating film; and the semiconductor integrated circuit apparatus being constructed such that one portion or all of the channel region of at least one MOS transistor within the basic cell region have an impurity concentration different from that in the channel region of another MOS transistor of the same conductivity type within the same basic cell.

In accordance with a second structure of the present invention, the MOS transistor having the different impurity concentration is used to separate elements from each other and has a threshold voltage at which no MOS transistor is operated at a power voltage of this semiconductor integrated circuit apparatus. Thus, it is possible to reduce an area for an element separating region.

In accordance with a third structure of the present invention, the gate electrode of the MOS transistor having the different impurity concentration and used for element separation is used as wiring. Thus, it is possible to separate electric elements from each other with high circuit flexibility.

In accordance with a fourth structure of the present invention, the above third object can be achieved by a semiconductor integrated circuit apparatus comprising a basic cell region formed by arranging a plurality of basic cells each including a MOS transistor in longitudinal and transversal directions; the MOS transistor having source-drain section diffusive regions formed on a semiconductor substrate, and a gate electrode formed on a channel region between these source-drain section diffusive regions through a gate insulating film; and the semiconductor integrated circuit apparatus being constructed such that impurities of a conductivity type opposite to that in at least one diffusive region are deeply implanted into this diffusive region at a high concentration and a withstand voltage of a PN-junction between this diffusive region and the substrate is lower than that of another PN-junction of the same conductivity type. Thus, it is possible to obtain a protecting element having a drain withstand voltage lower than a gate withstand voltage of an internal circuit.

In a fifth structure of the present invention, the PN-junction having the low withstand voltage is used for a surge protecting element in a terminal section.

In a sixth structure of the present invention, the impurities of a conductivity type opposite to that in the diffusive region are deeply implanted into this diffusive region at a high concentration until the PN-junction having the low withstand voltage has Zener characteristics. Thus, it is possible to provide a constant voltage circuit in which no operation of the constant voltage circuit is changed so much by a change in temperature.

In accordance with a seventh structure of the present invention, the above fifth object can be achieved by a semiconductor integrated circuit apparatus comprising a basic cell region formed by arranging a plurality of basic cells each including a MOS transistor in longitudinal and transversal directions; the MOS transistor having source-drain section diffusive regions formed on a semiconductor substrate, and a gate electrode formed on a channel region between these source-drain section diffusive regions through a gate insulating film; and the semiconductor integrated circuit apparatus being constructed such that ions are implanted into one portion of a channel of at least one MOS transistor to narrow an effective channel width of this MOS transistor. Thus, a logic threshold voltage is arbitrarily set and the size of a circuit structure is reduced and an excessive direct current flow is restricted.

In accordance with an eighth structure of the present invention, the MOS transistor having the narrowed effective channel width is used as an access gate of a memory cell. Thus, it is possible to provide a high speed memory having no error in operation.

In accordance with a ninth structure of the present invention, the above seventh object can be achieved by a static RAM formed on a semiconductor integrated circuit of a master slice type formed by arranging a plurality of basic cells each composed of a P-channel type MOS transistor and an N-channel type MOS transistor on the same semiconductor chip in longitudinal and transversal directions; the static RAM being constructed such that ions are implanted into one portion of a channel of at least one MOS transistor to narrow an effective channel width of this MOS transistor; and one bit line is connected to a latch section of a memory cell through one access gate so that a writing operation of the static RAM is performed by a single signal. Thus, it is possible to provide a writable SRAM with respect to a single signal.

To attain the eighth object, in tenth to twelfth structures of the present invention, a SRAM for setting an initial state of a memory cell is realized as follows when a power source is turned on. Namely, in the present invention, when a predetermined voltage is applied to the memory cell from a bit line through MOS transistors for access, operating characteristics of the memory cell are changed to set the initial state thereof by implanting ions into a channel of at least one MOS transistor with respect to the memory cell and the MOS transistors for access. The ions are implanted into the channel by controlling a threshold voltage value such that no one portion of a channel region forms the channel to narrow an effective channel width and the channel is formed at a specific voltage in the range of a normal power potential by implanting the ions into the entire channel region.

The present invention also resides in a method for manufacturing a semiconductor integrated circuit apparatus, comprising the steps of a master process for forming a source-drain section diffusive region and a gate electrode, or the source-drain section diffusive region, the gate electrode and a portion of wiring; and a custom process for forming the wiring and including a process for controlling an impurity concentration in one portion or all of a channel region of at least one MOS transistor such that this impurity concentration is different from that in a channel region of another MOS transistor of the same conductivity type. For example, the process for controlling the impurity concentration is executed before or after the wiring is formed after the formation of the gate electrode.

When boron as an ion is implanted into an NMOS transistor to perform a channel-doping operation, an implanting amount of boron is set from $1 \times 10^{12}/cm^2$ to $3 \times 10^{12}/cm^2$ and accelerating energy of boron is set to about 30 KeV. In this case, a threshold voltage of this NMOS transistor is equal to 0.7 to 1.0 volt. In contrast to this, when the implanting amount of boron is set from $4 \times 10^{13}/cm^2$ to $5 \times 10^{13}/cm^2$ and the accelerating energy of boron is set to about 180 KeV, the threshold voltage of this NMOS transistor is equal to about 6 volts. Accordingly, no NMOS transistor is operated at a power voltage such as 5 volts normally used to operate the semiconductor integrated circuit apparatus.

Similarly, in the case of a PMOS transistor, when phosphorus or arsenic as an ion is implanted into a channel, an implanting amount of phosphorus or arsenic is set from $10^{10}/cm^2$ to $10^{13}/cm^2$ and accelerating energy of phosphorus or arsenic is set from 100 to 200 KeV so that a threshold voltage of this PMOS transistor is equal to about 6 volts. Accordingly, no PMOS transistor is operated at a normal power voltage such as 5 volts.

If ions are implanted into the entire channel of a certain MOS transistor to increase a threshold voltage thereof as mentioned above, this MOS transistor functions as a transistor for separating electric elements from each other.

A diode formed by a PN-junction shows Zener characteristics if a P-type concentration and an N-type concentration in the PN-junction are set to be high. If this junction is used for a Zener diode, it is possible to form a constant voltage circuit in which no operation of the constant voltage circuit is changed so much by a change in temperature.

If ions are implanted into one portion of the channel of the MOS transistor so as to increase the threshold voltage thereof, an effective channel width of this MOS transistor is changed. A logic threshold voltage of the MOS transistor having the changed effective channel width can be adjusted in combination with another MOS transistor.

Further, it is possible to provide a high speed memory of a pre-charging system having no error in operation by using the MOS transistor having a narrowed effective channel width as an access gate.

Further objects and advantages of the present invention will be apparent from the following description of the preferred embodiments of the present invention as illustrated in the accompanying drawings.

BRIEF DESCRIPTION OF THE DRAWINGS

FIG. 3b is a diagram showing an electric circuit equivalent to this electric circuit corresponding to FIG. 9a;

FIG. 4b is a diagram showing an electric circuit equivalent to this logic circuit corresponding to FIG. 10a;

DESCRIPTION OF THE PREFERRED EMBODIMENTS

The preferred embodiments of a semiconductor integrated circuit apparatus and a manufacturing method thereof in the present invention will next be described in detail with reference to the accompanying drawings.

A field insulating film is used as a first example to separate electric elements from each other in a MOS transistor. In a second example, a turning-off MOS transistor having a gate electrode connected to a power source is used to separate electric elements from each other in a MOS transistor.

Figure 1A:
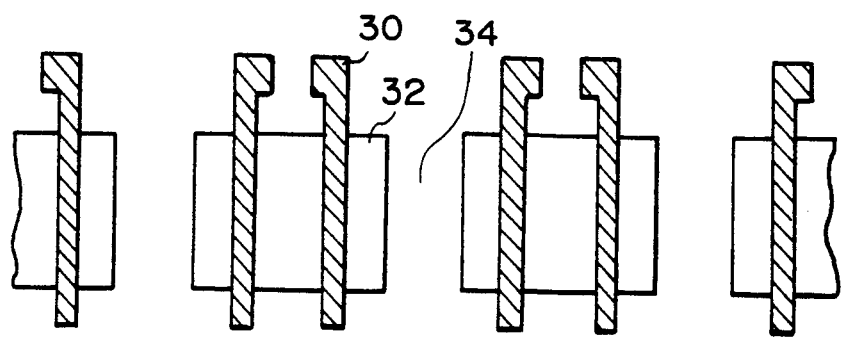
FIG. 1a is a schematic plan view showing element separation using a field oxide film in a general semiconductor integrated circuit apparatus.
Figure 1B:
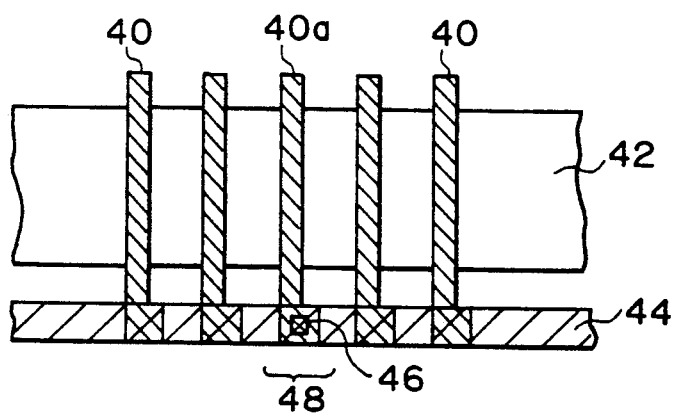
FIG. 1b is a schematic plan view showing element separation in a general semiconductor integrated circuit apparatus in which a gate electrode is connected to a power source.

As shown in FIG. 1a, in the element separation using the field insulating film, a diffusive layer 32 is formed by a gate electrode 30 in a self-aligning manner in a region surrounded by an element separating region 34 provided by the field insulating film. As shown in FIG. 1b, in the element separation using the gate electrode connected to the power source, a gate electrode 40a in an element separating region 48 is connected to power source wiring 44 through a contact 46. Reference numerals 42 and 40 respectively designate a diffusive region and a gate electrode of another MOS transistor.

Figure 2A:
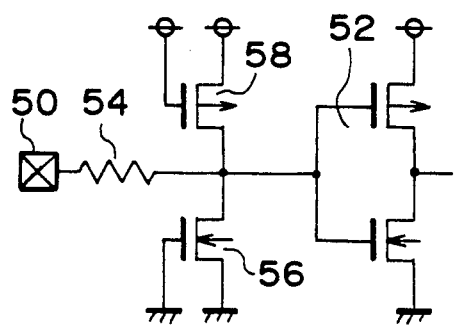
FIG. 2a is a diagram showing a general protecting circuit.

In the MOS transistor, it is necessary to dispose a protecting circuit since a gate insulating film is generally weak in external surge. In the protecting circuit, a protecting element having a withstand voltage lower than a gate withstand voltage of the MOS transistor is usually connected to the gate electrode so as to absorb the external surge by this protecting element. As shown in FIG. 2a, protecting elements 56 and 58 are used as a surge protecting circuit of the MOS transistor. Each of these surge protecting elements 56 and 58 has a withstand voltage lower than a gate withstand voltage of the MOS transistor in an internal circuit 52. The surge protecting elements 56 and 58 are connected between an input terminal 50 and the internal circuit 52 together with a protecting resistor 54.

In a CMOS-type master slice, PMOS and NMOS transistors included in a basic cell are set to have respective intrinsic sizes. Accordingly, when a certain logic circuit is constructed by using this basic cell, a threshold voltage of this logic circuit is definitely determined.

Figure 5A:
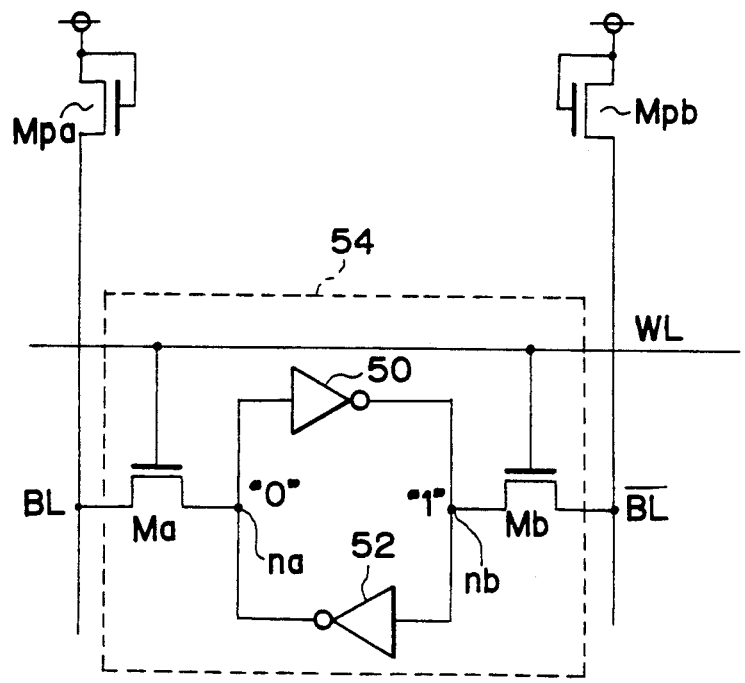
FIG. 5a is a circuit diagram showing one memory cell portion of a static RAM.

FIG. 5a shows one memory cell portion of a static RAM (which is called a SRAM in the following description). A memory cell 54 has a pair of inverters 50 and 52 and access gates Ma and Mb. A word line WL is disposed to select the access gates Ma and Mb. Bit lines BL and $\overline{BL}$ (BLB) ($\overline{B}$ designates an inversion of B) are respectively connected to sense circuits and are respectively connected to a power source through gates Mpa and Mpb for pre-charge on these bit lines.

In the element separation using the field insulating film 34 as shown in FIG. 1a, a space for element separation is increased and a circuit structure has a low flexibility. Namely, basic gates separated from each other by the field insulating film have generally two inputs. Accordingly, when the circuit structure is constructed such that the basic gates have three or five inputs, there are unused gate electrodes so that the flexibility with respect to the number of input signals is low.

In the element separating region shown in FIG. 1b, it is necessary to dispose a region for connecting the gate electrode 40a to the power source wiring 44, thereby reducing wiring efficiency. Further, it is impossible to use this gate electrode 40a in wiring so that the wiring efficiency is further reduced.

Figure 2B:
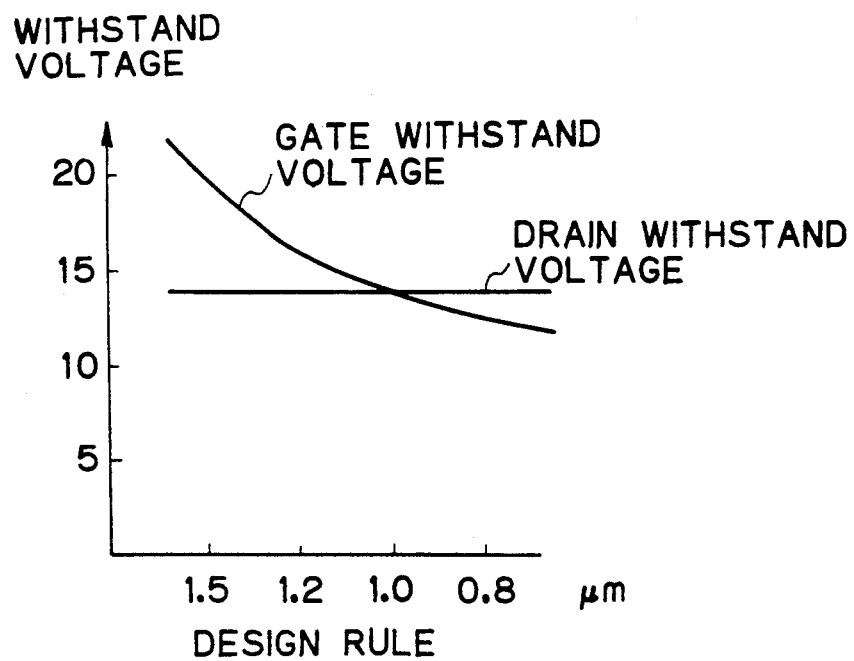
FIG. 2b is a graph showing the relation between the fineness of an element in structure and a withstand voltage.

Recently, an electric element has been finely formed. Such an electric element has a fine structure so that the gate insulating film is made thin in accordance with a scaling law. A gate withstand voltage depends on a thickness of the gate insulating film. Accordingly, the gate withstand voltage is reduced as the gate insulating film is made thin. The general surge protecting element is constructed by a MOS transistor equal to that constituting an internal logic circuit. Accordingly, no drain withstand voltage of the protecting element is reduced by taking various kinds of measures for securing reliability of the MOS transistor. Therefore, as shown in FIG. 2b, the gate withstand voltage is set to be lower than the drain withstand voltage of the protecting element as a size of the protecting element is reduced. In such a reversing phenomenon, such a protecting element cannot function as a normal protecting element.

In a general diode having a PN-junction, a backward withstand voltage depends on temperature so that this diode cannot be used as a constant voltage circuit.

Figure 3A:
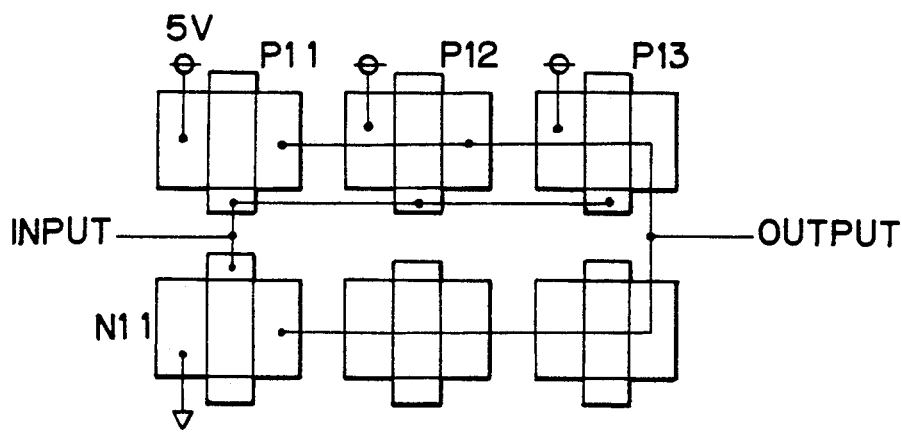
FIG. 3a is a schematic plan view showing an electric circuit corresponding to FIG. 9a and constructed by a general master slice.
Figure 3B:
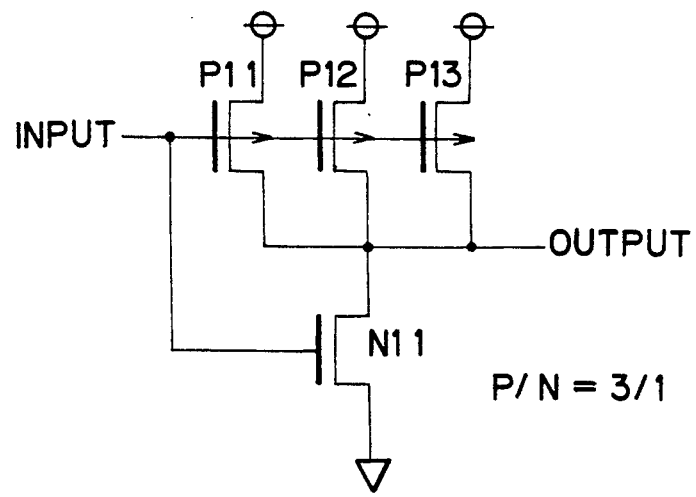
Figure 4A:
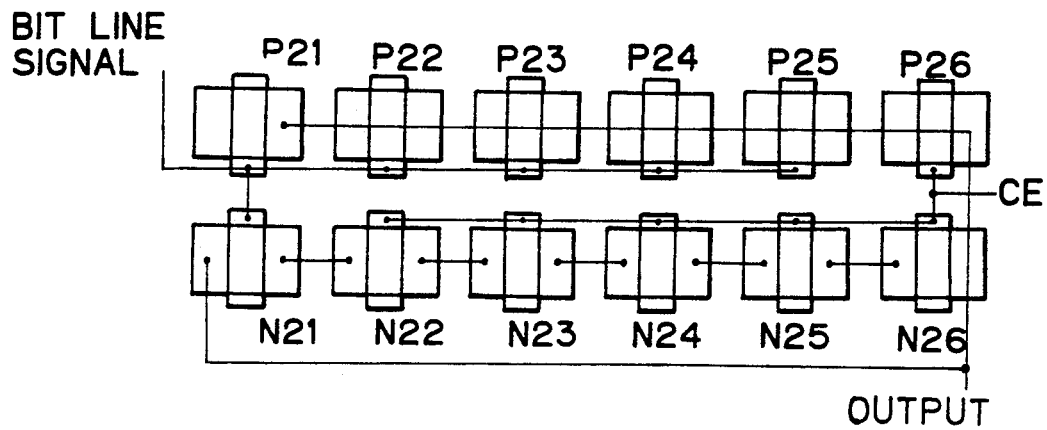
FIG. 4a is a schematic plan view showing an example of a logic circuit corresponding to FIG. 10a and constructed by a general master slice.
Figure 4B:
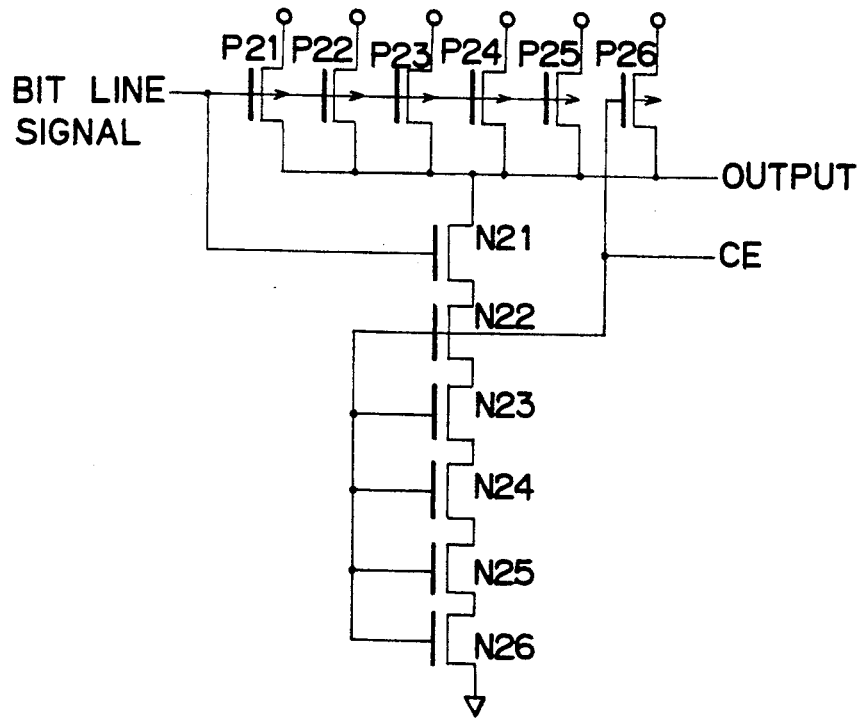

When the threshold voltage of the logic circuit is changed by using a general CMOS-type basic cell, plural PMOS transistors and plural NMOS transistors are connected in series or parallel to each other by combining these transistors with each other. This threshold voltage must be set by using a ratio of the number of PMOS transistors and the number of NMOS transistors. For example, FIG. 3a shows an inverter constructed such that this inverter has a desirable threshold voltage. This inverter is constructed by three PMOS transistors P11, P12 and P13 and one NMOS transistor N11. An electric circuit equivalent to this inverter is shown in FIG. 3b. FIG. 4a shows a sense amplifier of a ROM as one example of a logic circuit requiring more basic cells. This sense amplifier includes six PMOS transistors P21 to P26 and six NMOS transistors N21 to N26. FIG. 4b shows an electric circuit equivalent to this sense amplifier.

As mentioned above, when the logic circuit is constructed by using the general CMOS-type master slice and its logic threshold voltage is changed, it is necessary to dispose plural PMOS and NMOS transistors. Therefore, an area for these MOS transistors is increased on a master slice chip.

Further, the number of used PMOS transistors is not necessarily in conformity with the number of used NMOS transistors. Accordingly, some MOS transistors are unused and the size of a circuit structure is increased.

As mentioned above, each of the PMOS and NMOS transistors included in the basic cell has a constant size. Accordingly, this size is larger than the size of a minimum transistor required to flow a required electric current therethrough so that a direct electric current excessively flows through the MOS transistors.

Figure 5B:
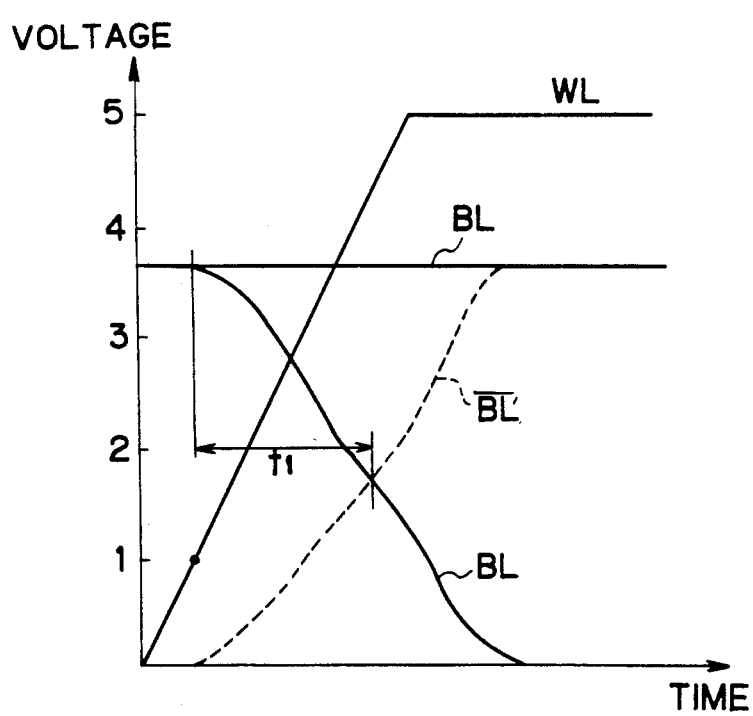
FIG. 5b is a graph showing the relation between a voltage and a time in a reading operation of the static RAM using a pre-charging system.
Figure 5C:
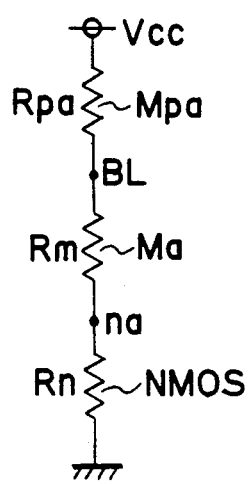
FIG. 5c is a diagram of an electric circuit equivalent to an electric circuit including one access gate in the static RAM.

A pre-charging method is one method for operating a memory at a high speed. In this pre-charging method, as shown in FIG. 5b, the bit lines BL and $\overline{BL}$ (BLB) are charged in advance such that these bit lines have an intermediate potential. An electric signal on the word line WL rises from this pre-charging state to start a data-reading operation. In this case, data of a memory cell are read therefrom by rising the electric signal on the word line WL while the bit lines BL and $\overline{BL}$ (BLB) are charged. For example, when a node na has a low voltage level, it is important that no value "0" at this node na is inverted to value "1". Namely, it is important that no electric potential Vna at the node na exceeds the threshold voltage of an inverter 50 disposed in a latch section of the memory cell. As shown in FIG. 5c, when the electric signal on the word line WL rises, the electric potential Vna at the node na is determined by the following ratio with respect to a resistor Rpa of the MOS transistor Mpa for pre-charge, a resistor Rm of an access gate Ma and a resistor Rn of an NMOS transistor disposed in an inverter section of a memory cell.

$$Vna = Vcc \times Rn/(Rpa + Rm + Rn)$$

No resistance of the resistor Rpa can be increased so much since it is necessary to perform the pre-charging operation at a high speed so as to increase a reading speed in the next cyclic reading operation after the preceding reading operation is completely performed. The resistance of the resistor Rpa is set to about 1/N times that of each of the resistors Rm and Rn where N designates 5, 6, etc. Accordingly, the electric potential Vna at the node na is approximately determined by the resistances of the resistors Rm and Rn. If the resistances of the resistors Rm and Rn are equal to each other, the electric potential Vna at the node na is equal to about 2.5 volts when the voltage of a power source Vcc is set to 5 volts. Therefore, this electric potential Vna exceeds a threshold voltage. To prevent such data inversion in the memory cell, (1) it is necessary to increase the resistance of the resistor Rm, or (2) it is necessary to reduce the resistance of the resistor Rn.

It is necessary to take measures (1) and/or (2) to prevent the data inversion in the memory cell. The measures (1) are normally taken so as not to increase an area for the memory cell.

Figure 6A:
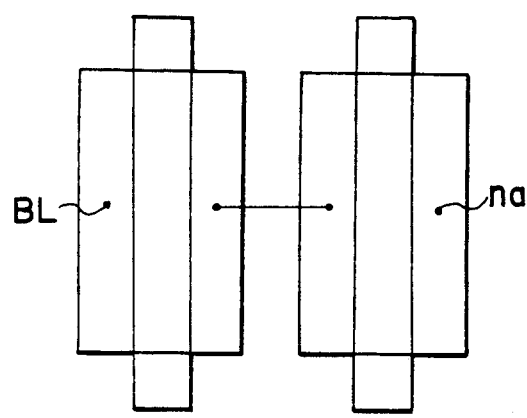
FIG. 6a is a schematic plan view showing a general system for preventing an error in operation of a memory cell shown in FIGS. 4a and 4b and showing an example in which the resistance of an access gate is increased.
Figure 6B:
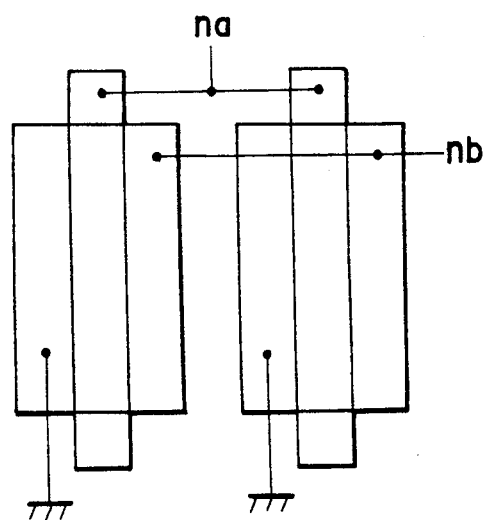
FIG. 6b is a schematic plan view showing a general system for preventing an error in operation of a memory cell shown in FIG. 4 and showing an example in which the resistance of an NMOS transistor disposed in an inverter is reduced.

In the semiconductor integrated circuit apparatus of a master slice type, each of the PMOS and NMOS transistors is set to have an intrinsic channel width. Therefore, if the memory cell shown in FIG. 5a is formed in the semiconductor integrated circuit apparatus of a master slice type, MOS transistors are connected in series with each other as shown in FIG. 6a in accordance with the measures (1). In contrast to this, in accordance with the measures (2), MOS transistors are connected in parallel with each other as shown in FIG. 6b. In both the measures (1) and (2), the number of used gates is increased and the area for the memory cell is increased.

In another proposed method, a basic unit of the semiconductor integrated circuit apparatus of a master slice type is set by adding PMOS and NMOS transistors and an NMOS transistor of a size smaller than that of each of the PMOS and NMOS transistors to a basic unit cell. When a memory is constructed, the small-sized NMOS transistor is used as an access gate. For example, such a method is shown in "Monthly Semiconductor World" published in February in 1990, pp. 92 to 95. However, in this method, an area for the basic unit cell is increased by adding the small-sized NMOS transistor to this basic unit cell.

In the SRAM, complementary signals on the bit lines BL and $\overline{BL}$ (BLB) are generally required in the writing operation as shown in FIGS. 5a to 5c. To provide a SRAM of high density, there is a method for reducing the number of data lines (bit lines) and the number of MOS transistors by setting each of the complementary signals in the writing operation to a single signal. A memory cell provided by using this method is shown in FIG. 12b. FIG. 12b shows an electric circuit equivalent to this memory cell in accordance with one embodiment of the present invention. When this memory cell is formed in the semiconductor integrated circuit of a master slice type, the PMOS and NMOS transistors are respectively set to have intrinsic sizes so that there is a possibility that an error in reading operation is caused when data are read out of the memory cell. Therefore, the memory cell is normally operated in a synchronous system and the data are read out of the memory cell in a pre-charging system. Further, for example, it is necessary to insert an inverter between an access gate and a latch section so as to prevent the read data from being fed back to the memory cell. Therefore, it is impossible to provide a SRAM of high density in the semiconductor integrated circuit of a master slice type.

Further, there is another SRAM in which an initial state of the memory cell can be set to prevent this initial state from being undefined when a power source is turned on. The initial state of the memory cell is set by changing operating characteristics thereof as one example of the SRAM. In this example, the size of a MOS transistor constituting the memory cell is changed by changing the width of a diffusive layer of the MOS transistor. The initial state of the memory cell is set by arbitrarily setting the operating characteristics of the memory cell. There is another memory cell for setting the initial state by changing memory cell circuits. For example, Japanese Patent Publication (KOKOKU) No. 2-30118 shows a memory circuit in which a load transistor constituting the memory cell is of a depression type. Further, Japanese Patent Publication (KOKOKU) No. 2-17875 shows a memory circuit in which electric circuits are changed to connect a gate electrode of a PMOS transistor in the memory cell having a CMOS structure to the ground.

However, no method for changing the width of the diffusive layer to change the operating characteristics of the memory cell can be applied to the semiconductor integrated circuit apparatus of a master slice type. Further, in the method for changing electric circuits of the memory cell, the electric circuits must be changed in accordance with a set value of the memory cell.

Figure 7A:
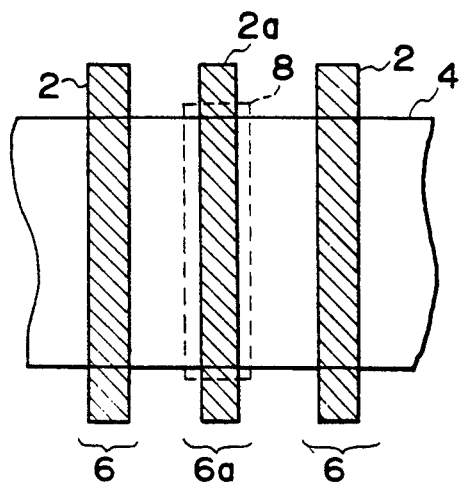
FIGS. 7a to 7c are views showing element separations different from each other in semiconductor integrated circuit apparatuses in accordance with different embodiments of the present invention.
Figure 7B:
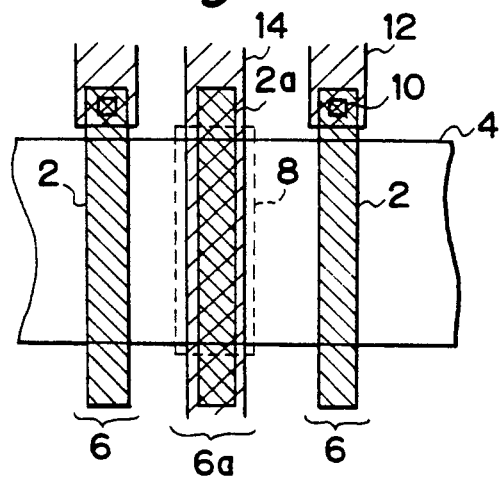
Figure 7C:
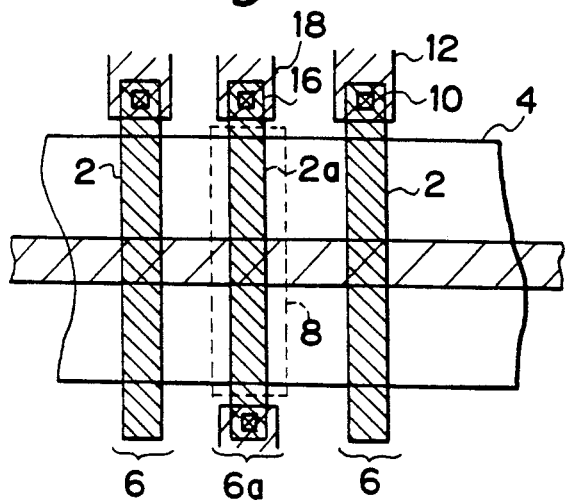

Each of FIGS. 7a to 7c shows a semiconductor integrated circuit apparatus in accordance with each of embodiments of the present invention in which electric elements are separated from each other by changing an impurity concentration in a channel region.

In FIG. 7a, a diffusive region 4 is formed by gate electrodes 2 and 2a in a self-aligning manner and MOS transistors 6 and 6a are respectively formed in the diffusive region 4. An impurity concentration in an entire channel region 8 of the MOS transistor 6a is different from that in another channel region of the MOS transistor 6 of the same conductivity type. When this MOS transistor 6a is constructed by an NMOS transistor, boron is implanted into the channel region 8 such that accelerating energy of boron is set to about 180 KeV and an implanting amount of boron is set from $4 \times 10^{13}/cm^2$ to $5 \times 10^{13}/cm^2$. Accordingly, a threshold voltage of the MOS transistor 6a is increased until about 6 volts. In contrast to this, when the MOS transistor 6a is constructed by a PMOS transistor, phosphorus or arsenic is implanted into the channel region 8 such that accelerating energy of phosphorus or arsenic is set from 100 to 200 KeV and an implanting amount of phosphorus or arsenic is set from $4 \times 10^{13}/cm^2$ to $5 \times 10^{13}/cm^2$. Accordingly, a threshold voltage of the MOS transistor 6a is increased until about 6 volts. Thus, no MOS transistor 6a is operated at 5 volts provided by an electric power source. Since the MOS transistor 6a is disposed in the diffusive region 4, the MOS transistors 6 and 6 on both sides of the MOS transistor 6a are separated from each other.

It is not necessary to connect any electric element to the gate electrode 2a in the MOS transistor 6a used to separate the MOS transistors from each other. In FIG. 7b, wiring efficiency is improved by arranging wiring 14 on the MOS transistor 6a. Wiring 12 is connected to the gate electrode 2 through a contact 10 in another MOS transistor 6.

In FIG. 7c, the gate electrode 2a of the MOS transistor 6a used for element separation is used as wiring and wiring 18 is connected to this gate electrode 2a through a contact 16 to improve wiring efficiency.

Figure 8A:
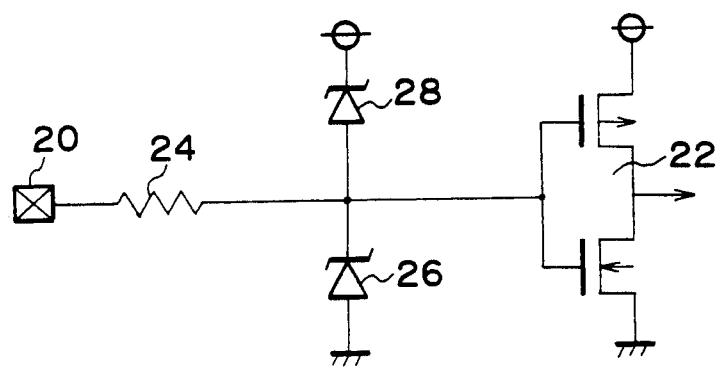
FIG. 8a is a circuit diagram showing an embodiment in which the present invention is applied to a protecting element.

In FIG. 8a, a protecting resistor 24 and protecting diodes 26 and 28 are connected as a surge protecting circuit of an internal circuit 22 between an input terminal 20 and the internal circuit 22. When the protecting diodes 26 and 28 are formed, ions are implanted into an NMOS transistor until a diffusive portion thereof to perform a channel doping operation. Thus P-type impurities reach a bottom portion of the diffusive portion and a PN-junction of high concentration is formed and used for a protecting element. Such a junction can be similarly formed in the case of a PMOS transistor.

Figure 8B:
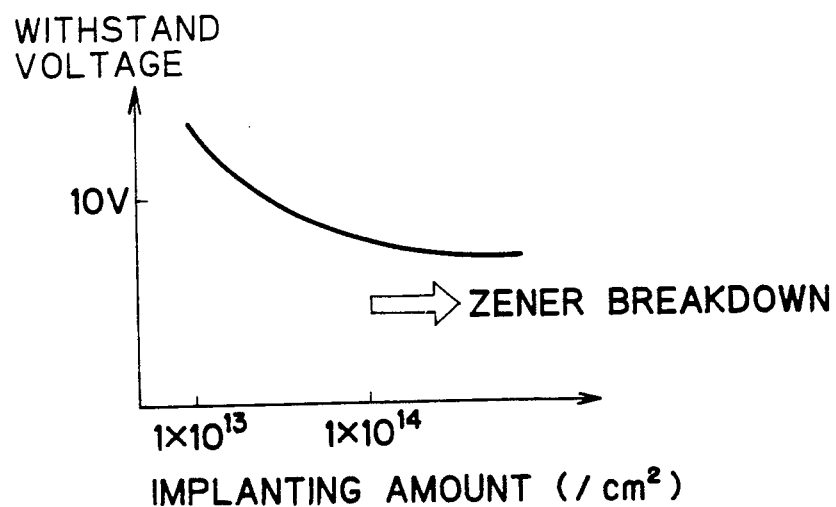
FIG. 8b is a graph showing the relation between an implanting amount of ions and a withstand voltage in the protecting element.

A withstand voltage at the PN-junction is reduced as an implanting amount of the ions is increased. FIG. 8b shows the relation between the implanting amount and the withstand voltage. It is possible to form a protecting diode having a desirable withstand voltage by suitably setting a channel doping condition. Accordingly, the MOS transistor can be protected from a surge by adding a protecting diode having a withstand voltage lower than a gate withstand voltage without any error in operation of the protecting diode.

For example, arsenic is implanted into an N-type diffusive layer when an ionic implanting amount of arsenic is equal to about $6 \times 10^{15}/cm^2$ and accelerating energy of arsenic is equal to 70 KeV by further increasing the impurity concentration. Further, $BF_2$ is implanted into this N-type diffusive layer when an ionic implanting amount of $BF_2$ is equal to $1 \times 10^{14}/cm^2$ to $5 \times 10^{14}/cm^2$ and accelerating energy of $BF_2$ is equal to 150 KeV. A PN-junction of high concentration thus obtained has Zener characteristics. If this PN-junction is used for a Zener diode, it is possible to form a constant voltage circuit in which no operation of the constant voltage circuit is changed so much by a change in temperature.

Figure 10A:
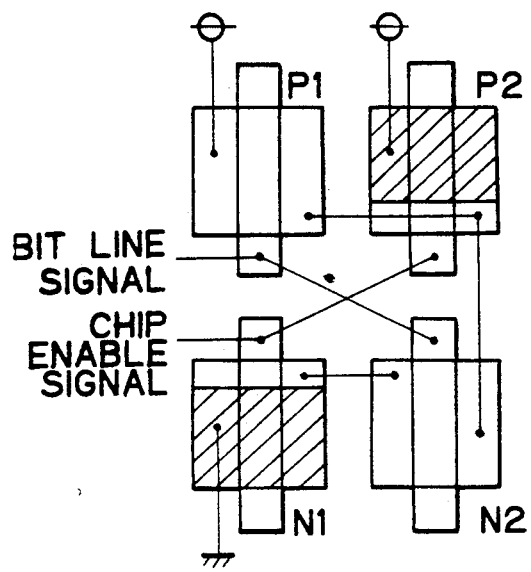
FIG. 10a is a schematic plan view showing another embodiment in which the present invention is applied to the control of an effective channel width.
Figure 10B:
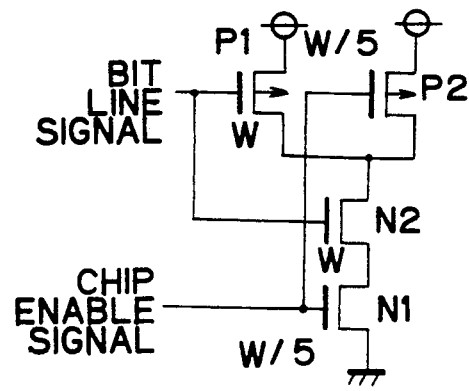
FIG. 10b is a diagram of an electric circuit equivalent to a circuit for controlling the effective channel width.
Figure 10C:
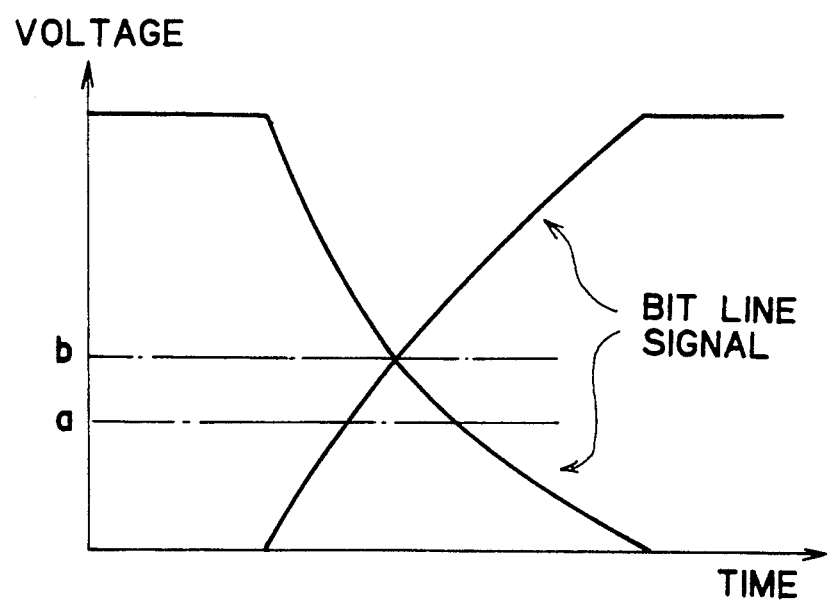
FIG. 10c is a graph showing the relation between a logic threshold voltage and a time with respect to a bit line signal in a sense amplifier of a ROM.
Figure 11:
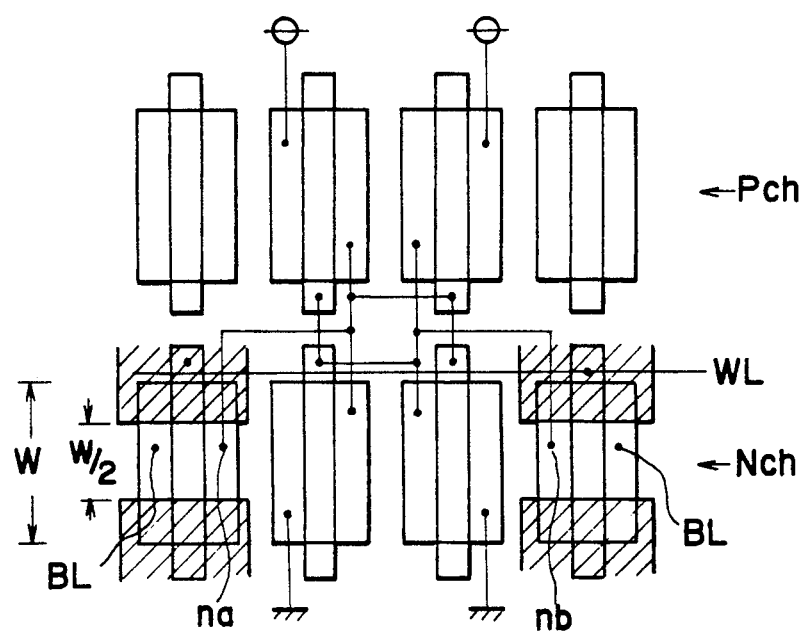
FIG. 11 is a schematic plan view showing an embodiment in which the present invention is applied to an access gate of a memory cell.

Each of FIGS. 9 to 11 shows an embodiment of the present invention in which a desirable electric circuit is constructed by controlling a channel width by implanting ions into one portion of a channel. A condition of ionic implantation for controlling the channel width is provided as follows when a MOS transistor as an object is constructed by an NMOS transistor. Boron is implanted into one portion of a channel region 8 such that accelerating energy of boron is set to about 180 KeV and an ionic implanting amount of boron is set from $4 \times 10^{13}/cm^2$ to $5 \times 10^{13}/cm^2$. In contrast to this, when the MOS transistor as an object is constructed by a PMOS transistor, phosphorus or arsenic is implanted into the channel region 8 such that accelerating energy of phosphorus or arsenic is set from 100 to 200 KeV and an ionic implanting amount of phosphorus or arsenic is set from $4 \times 10^{13}/cm^2$ to $5 \times 10^{13}/cm^2$. Thus, such an ionic implanting portion in the channel of this MOS transistor is not operated at 5 volts supplied from a power source so that an effective channel width of this MOS transistor is narrowed. In contrast to this, Japanese Patent Application Laying Open (KOKAI) No. 61-234546 proposed a method for controlling the channel width. This method is a method for controlling an operation of the MOS transistor in a source-drain region by changing the size of a mask of ionic implantation for forming a source and a drain. However, in this proposed method, it is necessary to align the source-drain region with a gate electrode so that this method is not suitable for a fine structure. Further, it is necessary to align a contact hall with the source-drain region. Therefore, if the source-drain region is narrowed, a degree of freedom in position of the contact hole is reduced. Further, the channel width can be narrowed to only an extent in which the contact hole can be formed. Accordingly, a selected channel width is limited in this control method.

Figures 9A, 9B:
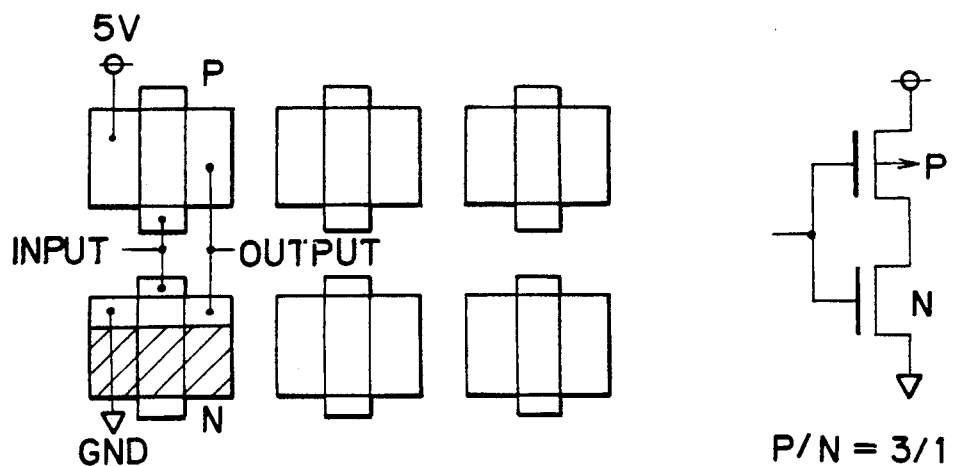
FIG. 9a is a schematic plan view showing an embodiment in which the present invention is applied to the control of an effective channel width.
FIG. 9b is a diagram of an electric circuit equivalent to a circuit for controlling the effective channel width.

FIG. 9a shows an embodiment of the present invention in which an inverter is constructed by controlling the channel width by implanting ions into one portion of the channel.

As illustrated in FIG. 9b showing an equivalent circuit of this inverter, the inverter is constructed by one PMOS transistor P and one NMOS transistor N. A channel doping operation for increasing a threshold voltage is performed in the NMOS transistor N in a channel portion having an area ⅔ times that of the channel of the NMOS transistor N. Accordingly, an effective channel width is reduced to a width ⅓ times that of the NMOS transistor included in a basic cell. As a result, a channel width ratio of the PMOS transistor P and the NMOS transistor N is equal to 3:1.

Figure 9C:
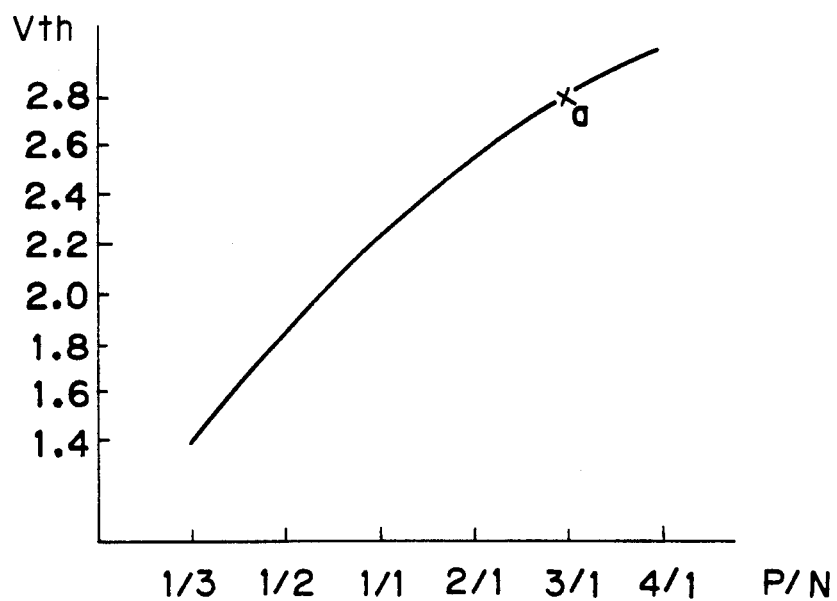
FIG. 9c is a graph showing a logic threshold voltage with respect to a channel width ratio of a PMOS transistor and an NMOS transistor in the control of the effective channel width.

FIG. 9c shows the relation between the threshold voltage and the channel width ratio of the PMOS transistor and the NMOS transistor. As shown in FIG. 9c, the threshold voltage Vth is increased as the channel width of the PMOS transistor is increased.

In FIG. 9a, the channel width is changed by implanting ions into one portion of the NMOS transistor to set the threshold voltage to a threshold voltage shown by reference numeral a on the curve in FIG. 9c. In FIG. 2a, the inverter having the same logic threshold voltage is constructed by a general basic cell. When the inverter shown in FIG. 9a is compared with that shown in FIG. 2a, it should be understood that four NMOS transistors are required in the general inverter, but only two NMOS transistors are required in the inverter in this embodiment, thereby reducing power consumption.

FIG. 10a shows an embodiment in which a sense amplifier of a ROM is constructed by using the present invention. In this embodiment, the sense amplifier uses two PMOS transistors P1 and P2 and two NMOS transistors N1 and N2. A threshold voltage of each of the PMOS transistor P2 and the NMOS transistor N1 is set to a high voltage such that no transistor portion corresponding to 4/5 times the channel width is operated at 5 volts supplied from a power source by implanting ions into this transistor portion. Thus, the effective channel width is reduced to 1/5 times.

FIG. 10b shows an equivalent circuit of the sense amplifier shown in FIG. 10a. This equivalent circuit is constructed by a NAND circuit. When the NAND circuit is constructed by two PMOS transistors and two NMOS transistors by using the general basic cell, a threshold voltage level of this NAND circuit is set to a voltage level shown by reference numeral a in FIG. 10c. In contrast to this, if an input signal on a bit line is changed as shown by reference numeral D, a large difference in reading speed is caused when low and high voltage levels are read. In this case, the reading speed of the sense amplifier is determined by a lower reading speed. In the sense amplifier shown in FIG. 10a, this logic threshold voltage level is increased to a voltage level shown by reference numeral b so that the reading speeds at the low and high voltage levels are approximately equal to each other. If the sense amplifier is constructed by using the general master slice such that the logic threshold voltage level is equal to the voltage level shown by reference numeral b in FIG. 10c, the sense amplifier is constructed as already described and shown in FIG. 4a. In such a case, the number of basic cells required to constitute this sense amplifier is increased and a circuit structure for the sense amplifier is large-sized and power consumption is also increased.

Similarly, the circuit structure can be minimized by changing the effective channel width in the present invention when it is necessary to dispose another sense amplifier of a memory, a logic circuit having a different ratio of PMOS and NMOS transistors, etc.

FIG. 11 shows another embodiment of the present invention in which the effective channel width is controlled by ionic implantation. An electric circuit shown in FIG. 11 realizes the memory cell 54 shown in FIG. 5a. In FIG. 11, a hatching portion constitutes a circuit portion channel-doped by the ionic implantation and unoperated at 5 volts supplied from the power source. Such a channel-doping operation is performed in access gates Ma and Mb constructed by NMOS transistors and shown in FIG. 5a. Thus, the channel width is limited from W to W/2 and an electric circuit equivalent to that shown in FIG. 6a is formed without increasing the number of used gates.

Figure 12A:
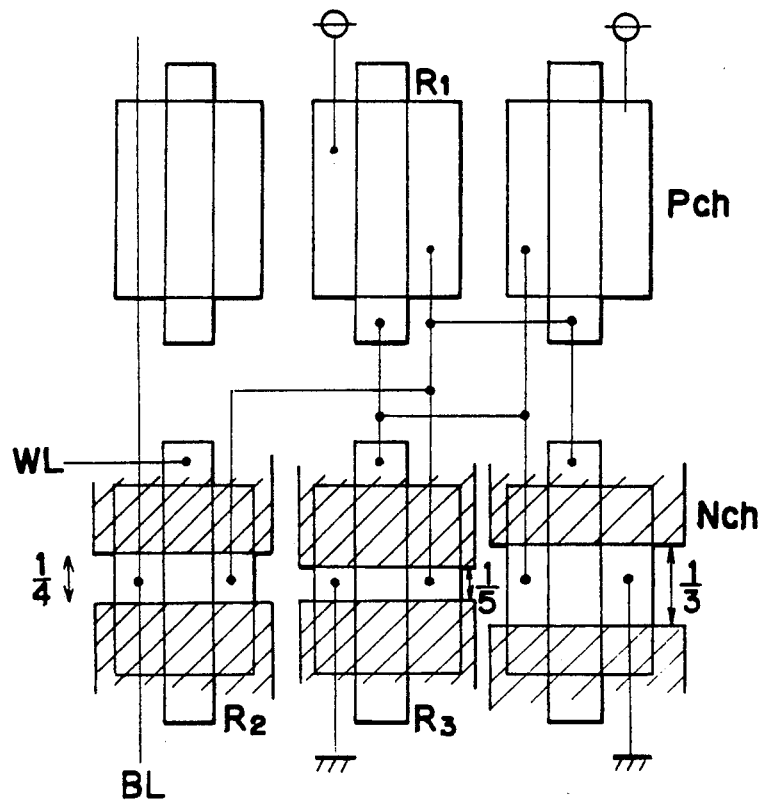
FIG. 12a is a schematic plan view showing an embodiment in which the present invention is applied to a writable SRAM with respect to a single signal.
Figure 12B:
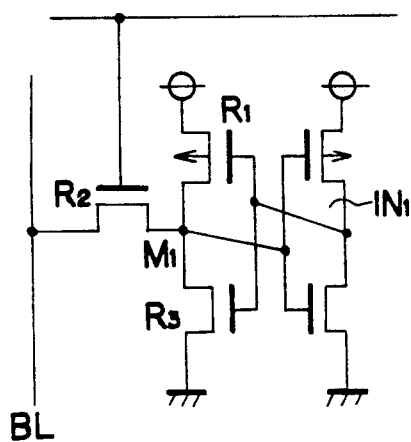
FIG. 12b is a diagram showing an electric circuit equivalent to the writable SRAM.

FIGS. 12a to 12d show an embodiment in which the present invention is applied to a writable SRAM with respect to a single signal. FIG. 12a shows a schematic plan view of the SRAM. In FIG. 12a, the channel width is limited by implanting ions into one portion of a channel of an NMOS transistor. A hatching portion in FIG. 12a shows a region in which no hatching channel portion is operated by the ionic implantation at 5 volts supplied from the power source. FIG. 12b shows an electric circuit equivalent to the SRAM shown in FIG. 12a.

Figure 12C:
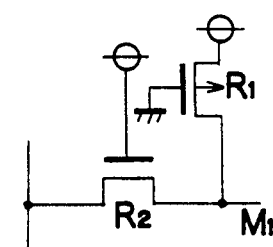
FIG. 12c is a diagram showing an electric circuit equivalent to the writable SRAM in a state in which value "0" is written to the SRAM.

The writing operation of a memory cell shown in FIGS. 12a to 12c will next be described. A threshold voltage of an inverter $IN_1$ disposed in a latch section is set to $V_{inv}$. When a data value "0" is written to the memory cell, an equivalent circuit can be represented as shown in FIG. 12c. At this time, the data value "0" can be written to the memory cell if a voltage $Vm_1$ at a node $M_1$ satisfies the following relation, $$V_{inv} < V \cdot R_2/(R_1+R_2)(=Vm_1) \qquad (1)$$

with respect to turning-on resistors $R_1$ and $R_2$ in a relative MOS transistor.

Figure 12D:
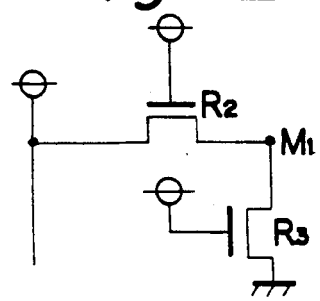
FIG. 12d is a diagram showing an electric circuit equivalent to the writable SRAM in a state in which value "1" is written to the SRAM.

When a data value "1" is written to the memory cell, the equivalent circuit can be represented as shown in FIG. 12d. In this case, the data value "1" can be written to the memory cell if the voltage $Vm_1$ at the node $M_1$ satisfies the following relation, $$V_{inv} > V \cdot R_3/(R_2+R_3)(=Vm_1) \qquad (2)$$

with respect to turning-on resistors $R_2$ and $R_3$ in a relative MOS transistor.

In FIG. 12a, the channel region of the NMOS transistor is limited by the ionic implantation. A limited width of the channel region is set such that the turning-on resistors of each of the MOS transistors satisfy the above relations (1) and (2). For example, the channel width of the MOS transistor arranged at a left-hand end in FIG. 12a and constituting an access gate is limited to ¼ times. The channel width of the central NMOS transistor on the right-hand side of this left-hand MOS transistor is limited to 1/5 times. Further, the channel width of the NMOS transistor arranged at the right-hand end in FIG. 12a is limited to ⅛ times.

Figure 13:
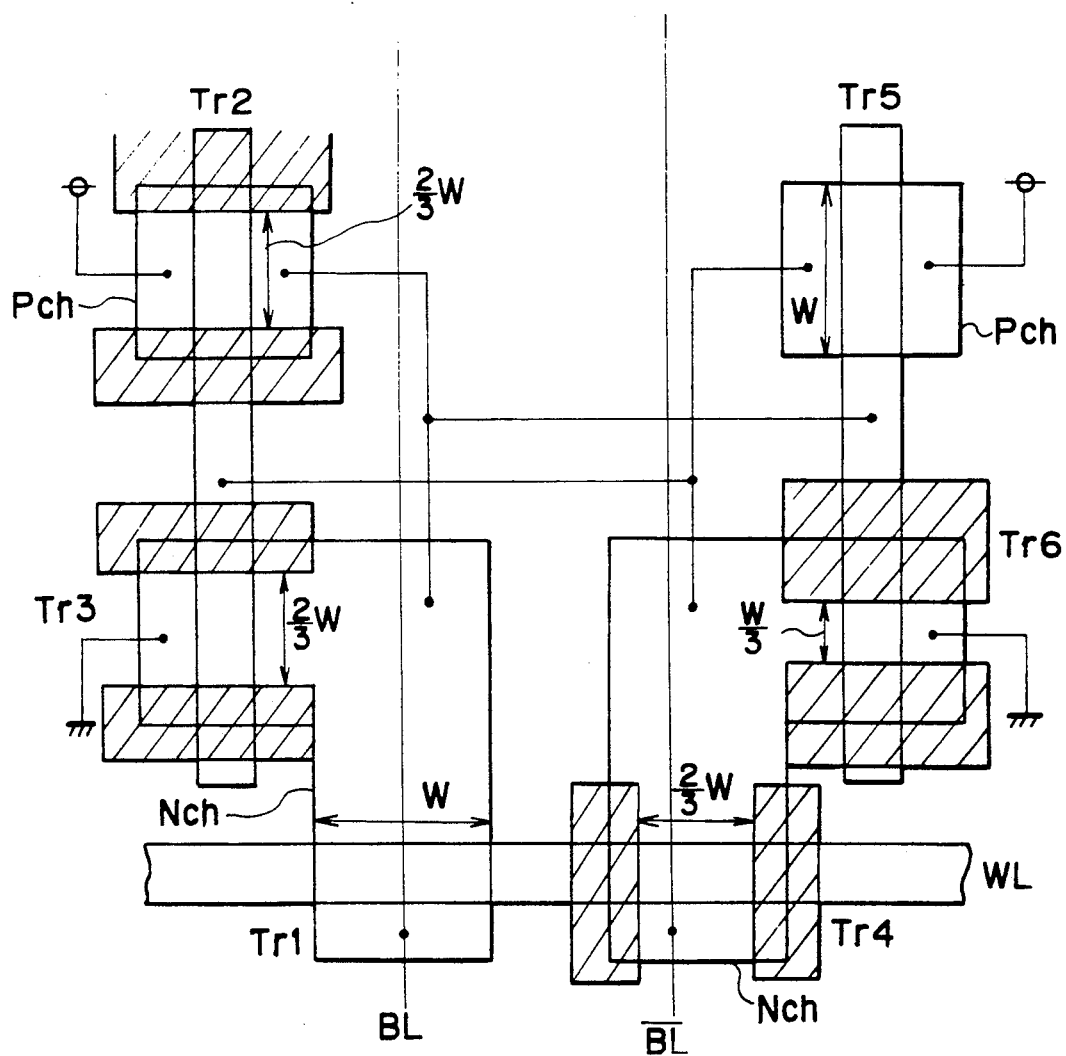
FIG. 13 is a schematic plan view showing an embodiment in which the present invention is applied to a SRAM for setting an initial state of a memory cell.

FIG. 13 shows a SRAM in accordance with an embodiment of the present invention in which an initial state of a memory cell is set. FIG. 13 shows the memory cell of a complete CMOS-type SRAM together with a MOS transistor for access.

Figure 14A:
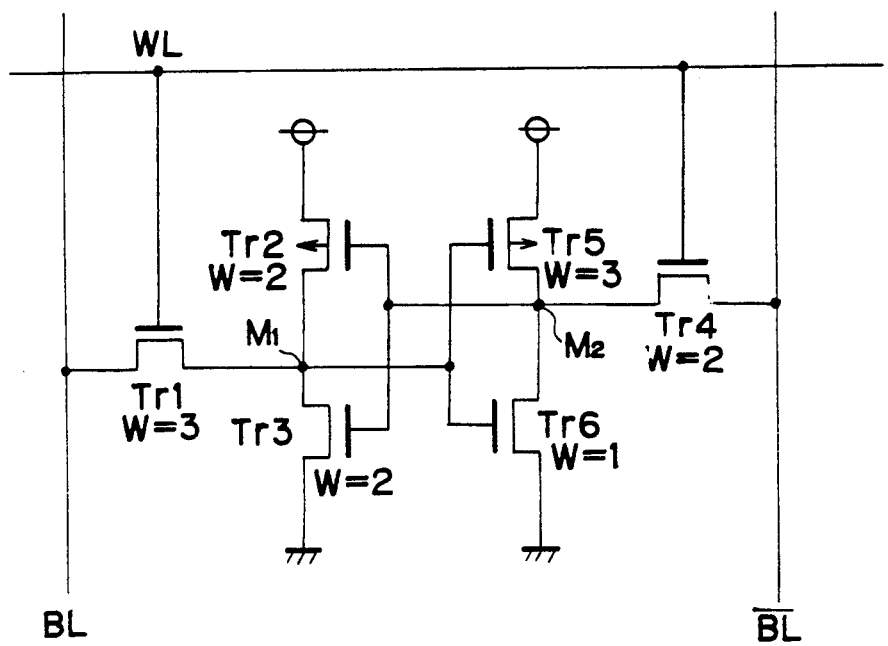
FIG. 14a is a diagram showing an electric circuit equivalent to the SRAM for setting the initial state of the memory cell in which a binary value "0" is set in this initial state.

FIG. 14a shows an electric circuit equivalent to the memory cell shown in FIG. 13. In FIG. 14a, a channel width of the memory cell is adjusted such that a binary value "0" is set in the initial state of the memory cell.

In a hatching region shown in FIG. 13, a channel-doping operation is performed to provide a threshold voltage at which no memory cell is operated at a normal power potential such as 5 volts. This memory cell constitutes a semiconductor integrated circuit apparatus of a master slice type. A basic channel width W of each of MOS transistors is adjusted and set to a predetermined channel width by performing the channel-doping operation. The channel width is limited to ⅔ times with respect to MOS transistors $Tr_2$, $Tr_3$ and $Tr_4$ and is limited to ⅓ times with respect to MOS transistor $Tr_6$. No channel-doping operation is performed with respect to MOS transistors $Tr_1$ and $Tr_5$.

Figure 14B:
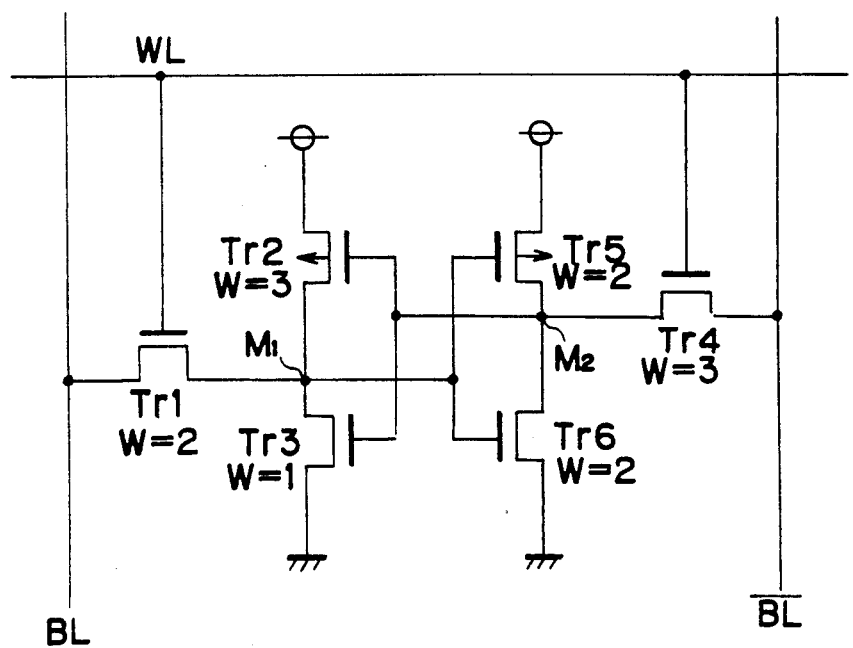
FIG. 14b is a diagram showing an electric circuit equivalent to the SRAM for setting the initial state of the memory cell in which a binary value "1" is set in this initial state.

An operation of the SRAM will next be described with reference to the equivalent circuit diagram shown in each of FIGS. 14a and 14b. FIG. 14a shows an example in which value "0" is set in the initial state of the memory cell. FIG. 14b shows an example in which value "1" is set in the initial state of the memory cell. In FIGS. 14a and 14b, the channel width is shown by a relative value.

A normal writing operation of each of these memory cells will first be described. When the data value "0" is written to the memory cell, a low voltage is applied onto a bit line BL and a high voltage is applied as a complementary signal onto another bit line $\overline{BL}$ (BLB). Further, the MOS transistors $Tr_1$ and $Tr_4$ as access gates are turned on through a read line WL. An electric potential at a memory node $M_1$ is determined by a ratio of turning-on resistances of the MOS transistors $Tr_1$ and $Tr_2$. The value "0" is written to the memory cell when the electric potential at the node $M_1$ is lower then the threshold voltage of an inverter formed by the MOS transistors $Tr_5$ and $Tr_6$. A write voltage can be changed by changing sizes of the MOS transistors $Tr_1$ and $Tr_2$.

In contrast to this, when the data value "1" is written to the memory cell, a high voltage is applied onto the bit line BL and a low voltage is applied onto the bit line $\overline{BL}$ (BLB). Further, the MOS transistors $Tr_1$ and $Tr_4$ as access gates are turned on through the word line WL. In this case, an electric potential at another memory node $M_2$ is determined by a ratio of turning-on resistances of the MOS transistors $Tr_4$ and $Tr_5$ by using a complementary signal. The value "1" is written to the memory cell when the electric potential at the node $M_2$ is lower than the threshold voltage of an inverter formed by the MOS transistors $Tr_2$ and $Tr_3$. A write voltage can be changed by changing sizes of the MOS transistors $Tr_4$ and $Tr_5$.

An operating state of the memory cell with respect to information can be set to an initial state at an arbitrary time by using this difference in write voltage. Namely, a voltage on a data line (bit line) is set between the above two write voltages so that the operating state of the memory cell with respect to information is set to the initial state determined by each of the sizes of the MOS transistors.

In FIGS. 13 and 14a, the value "0" is set in the initial state of the memory cell. In this case, when the voltage on the data line is equal to a set voltage, sizes of the respective MOS transistors $Tr_1$ to $Tr_6$ are set such that the voltage at the node $M_1$ is lower than the threshold voltage of the inverter formed by the MOS transistors $Tr_5$ and $Tr_6$, and the voltage at the node $M_2$ is higher than the threshold voltage of the inverter formed by the MOS transistors $Tr_2$ and $Tr_3$.

In contrast to this, in FIG. 14b, the value "1" is set in the initial state of the memory cell. In this case, when the voltage on the data line is equal to a set voltage, sizes of the respective MOS transistors $Tr_1$ to $Tr_6$ are set such that the voltage at the node $M_1$ is higher than the threshold voltage of the inverter formed by the MOS transistors $Tr_5$ and $Tr_6$, and the voltage at the node $M_2$ is lower than the threshold voltage of the inverter formed by the MOS transistors $Tr_2$ and $Tr_3$. A channel-doping pattern corresponding to FIG. 14b is symmetrical with respect to right and left and is similar to that shown in FIG. 13 with respect to this symmetry.

In the present invention, the channel width of a MOS transistor is narrowed by the channel-doping operation to change operating characteristics of the memory cell. Instead of this narrowing, the initial state of the memory cell can be set by setting a threshold voltage of each of the NMOS and PMOS transistors to a predetermined value in a range in which the NMOS and PMOS transistors are operated at a power voltage. In this case, this threshold voltage can be adjusted by implanting ions into the entire channel region such that an implanting amount of the ions is controlled.

Figure 15:
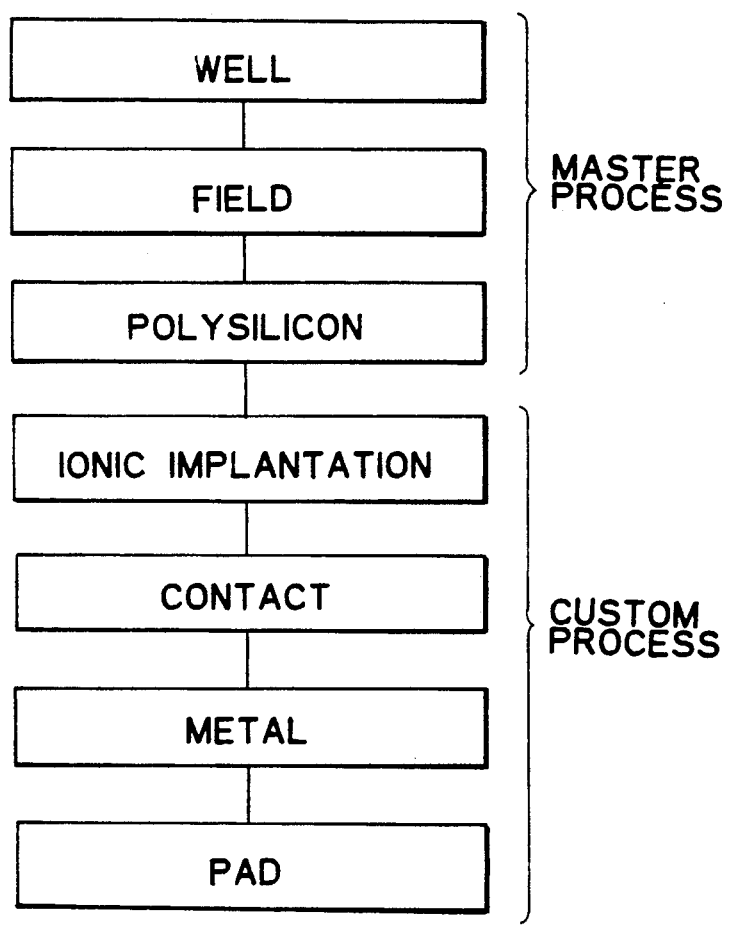
FIG. 15 is a flow diagram showing manufacturing processes of a semiconductor integrated circuit apparatus in the present invention.

FIG. 15 shows a manufacturing process including an ionic implanting process in the present invention. In a master process shown in FIG. 15, a well is formed in a substrate and an active region is formed by a field oxide film. After a gate oxide film is formed, a polysilicon film is stacked on the gate oxide film so that a gate electrode is formed by photoengraving and etching. Further, metal wiring may be formed in a first layer.

The next custom process has an ionic implanting process for changing a threshold voltage by performing a channel-doping operation in the present invention. In this ionic implanting process, an effective channel width is controlled and a withstand voltage is changed. Thereafter, a contact hole is formed in an insulating film between layers to form metal wiring. Finally, a passivation film is formed and a pad for bonding is disposed.

Ions may be implanted in the channel-doping operation after the metal wiring is formed.

As mentioned above, in accordance with first to third structures of the present invention, electric elements are separated from each other by ionic implantation. Accordingly, there is no field oxide film between adjacent basic gates of the same conductivity type. Therefore, it is possible to obtain a semiconductor integrated circuit apparatus of a master slice type with high density and circuit flexibility.

Further, it is not necessary to connect a gate electrode of a MOS transistor used for element separation to a power source. Therefore, wiring can be formed on the gate electrode and this gate electrode can be used as wiring so that wiring efficiency is improved.

In accordance with a fourth structure of the present invention, an electric element having a withstand voltage lower than a gate withstand voltage can be used as a protecting element so that tolerance for a surge is increased.

In accordance with a fifth structure of the present invention, a junction having Zener breakdown characteristics can be formed so that it is possible to provide a diode in which no operation of the diode is changed so much by a change in temperature.

In accordance with a seventh structure of the present invention, ions are implanted into one portion of the MOS transistor constituting a logic circuit to narrow its effective channel width. Accordingly, it is possible to provide a logic circuit having an arbitrary threshold voltage by using a small number of MOS transistors, thereby reducing the size of a circuit structure.

Further, the logic circuit for changing the logic threshold voltage can be constructed by PMOS transistors and NMOS transistors in a state in which the number of PMOS transistors is equal to the number of NMOS transistors. Accordingly, the number of unused MOS transistors is reduced so that the circuit structure can be efficiently used.

Power consumption is also reduced by narrowing the effective channel width of the MOS transistor.

In accordance with an eighth structure of the present invention, a turning-on resistance of an access gate of a memory cell can be arbitrarily adjusted so that it is possible to provide a high speed memory having no error in operation without increasing the number of used gates.

In accordance with a ninth structure of the present invention, it is possible to arbitrarily set the size of a transistor within a memory cell in a SRAM constituting a semiconductor integrated circuit of a master slice type. Accordingly, it is possible to provide a writable SRAM with respect to a single signal realizing a high density memory without increasing the number of used gates.

In accordance with tenth to twelfth structures of the present invention, an initial state of the SRAM can be set during a manufacturing process for a channel-doping operation. Accordingly, a manufacturing time can be reduced and designs of the memory cell can be changed without changing a circuit structure of the memory cell. The manufacturing time can be also reduced and the designs of the memory cell can be also changed without changing the circuit structure of the memory cell in the case of the semiconductor integrated circuit apparatus of a master slice type.

Many widely different embodiments of the present invention may be constructed without departing from the spirit and scope of the present invention. It should be understood that the present invention is not limited to the specific embodiments described in the specification, except as defined in the appended claims.

What is claimed is:

1. A semiconductor integrated circuit apparatus comprising:
    a basic cell region formed by arranging a plurality of basic cells, each of said plurality of basic cells including a plurality of MOS transistors, in longitudinal and transversal directions;
    each of said plurality of MOS transistors having source and drain section diffusive regions, implanted with impurities of a conductivity type opposite to that in said diffusive regions, formed on a semiconductor substrate, and a gate electrode formed on a channel region between said source and drain section diffusive regions through a gate insulating film;
    the semiconductor integrated circuit apparatus being constructed such that the source and drain section diffusive regions of a first one of said plurality of MOS transistors is deeply implanted with said impurities at a high concentration and a withstand voltage of a first PN-junction between the diffusive region and the substrate of the first MOS transistor is lower than that of a second PN-junction between the substrate and a diffusive region of a second MOS transistor.

2. A semiconductor integrated circuit apparatus as claimed in claim 1, wherein said first PN-junction having the lower withstand voltage is used as a surge protecting element in a terminal section.

3. A semiconductor integrated circuit apparatus as claimed in claim 1, wherein said first PN-junction having the lower withstand voltage has Zener characteristics.

4. A static RAM formed on a semiconductor integrated circuit of a master slice type formed by arranging a plurality of basic cells, each of said plurality of basic cells composed of a P-channel type MOS transistor and an N-channel type MOS transistor, on the same semiconductor chip in longitudinal and transversal directions, said static RAM comprising:
    a first MOS transistor of a memory cell in which a pair of CMOS inverter circuits are connected to each other;
    a second MOS transistor for access which is connected to each of memory nodes and has a word line signal as a gate input,
    ions being implanted into a channel of at least one of said first and second MOS transistors to change operating characteristics of the memory cell so that an operating state of the memory cell is set to an initial state when a predetermined voltage is applied to the memory cell from a bit line through the MOS transistor for access.

5. A static RAM as claimed in claim 4, wherein the ions are implanted into one portion of said channel region in said at least one MOS transistor so as to set a threshold voltage in this ionic implanting portion such that no channel is formed at a normal power potential and narrow an effective channel width.

6. A static RAM as claimed in claim 4, wherein the ions are implanted into an entire region of said channel in said at least one MOS transistor having the implanted ions such that a threshold voltage of said at least one MOS transistor is equal to a predetermined value for forming the channel at a normal power potential.

7. A master slice type semiconductor integrated circuit apparatus comprising:
    a basic cell region in which a plurality of basic cells are arranged, each of the basic cells including a plurality of MOS transistors, each of said plurality of MOS transistors having source and drain section diffusive regions formed on a semiconductor substrate and a gate electrode formed on a channel between said source and drain section diffusive regions through a gate insulating film;
    wherein ions are implanted into a part of the channel of at least one of the plurality of MOS transistors included in a basic cell to change the effective channel width of said at least one of the plurality of MOS transistors in such a manner that a threshold level of voltage of the implanted part is set at a voltage level in which said part of the channel does not operate within a normal operating voltage of a current source.

8. A master slice type semiconductor integrated circuit apparatus according to claim 7, wherein the ions are implanted in such a manner as to change a threshold level of a logic element.

9. A master slice type semiconductor integrated circuit apparatus according to claim 7, wherein the apparatus is constructed in such a manner as to control an ON electric current of said at least one of the plurality of MOS transistors.

10. A master slice type semiconductor integrated circuit apparatus according to claim 7, wherein the apparatus is constructed in such a manner as to control a rising up or a falling down of an output signal of said at least one of the plurality of MOS transistors.

11. A master slice type semiconductor integrated circuit apparatus as set forth in claim 7, wherein the apparatus is constructed as a SRAM in which characteristics of memory cells are changed and a writing is executed by a single signal.

12. A master slice type semiconductor integrated circuit apparatus as set forth in claim 7, wherein the apparatus is constructed as a SRAM in which characteristics of memory cells are changed and an initializing is executed.

13. A master slice type semiconductor integrated circuit apparatus comprising:
   a basic cell region in which a plurality of basic cells are arranged, each of the basic cells including a MOS transistor;
   said MOS transistor having source and drain diffusive regions formed on a semiconductor substrate;
   wherein ions are implanted into all of the channel of at least one of the MOS transistors in such a manner that a threshold level of voltage of said channel is set at a voltage level in which said channel does not operate within a normal operating voltage of a current source so that a gate electrode of said at least one MOS transistor is used as a wiring formed on said channel between said source and drain diffusive regions through a gate insulating film.

14. A master slice type semiconductor integrated circuit apparatus comprising:
   a basic cell region in which a plurality of basic cells are arranged, each of the basic cells including a plurality of MOS transistors;
   each of said plurality of MOS transistors having source and drain section diffusive regions implanted with impurities of a conductivity type opposite to that in said diffusive regions formed on a semiconductor substrate and a gate electrode formed on a channel through a gate insulating film;
   wherein impurities are deeply implanted into the source and drain diffusive regions of a first one of said plurality of MOS transistors at a high density, and a breakdown voltage of a first PN-junction between the diffusive region and the substrate of the first MOS transistor is lower than the breakdown voltage of a second PN-junction between the substrate and the diffusive region of a second MOS transistor into which the impurities are not deeply implanted.

15. A master slice type semiconductor integrated circuit apparatus as claimed in claim 14, wherein said first PN-junction having the lower breakdown voltage is used as a surge protecting element in a terminal section.

16. A master slice type semiconductor integrated circuit apparatus as claimed in claim 14, wherein said first PN-junction having the lower breakdown voltage has Zener characteristics.

* * * * *

UNITED STATES PATENT AND TRADEMARK OFFICE
CERTIFICATE OF CORRECTION

PATENT NO. : 5,285,069
DATED : February 8, 1994
INVENTOR(S) : Mitsuo KAIBARA, Hiizu OKUBO, Takako MALUYAMA, Seiji YAMANAKA and Hideyuki AOTA It is certified that error appears in the above-indentified patent and that said Letters Patent is hereby corrected as shown below:

Title page, left-hand column, section 30, under "September 18, 1991 [JP] Japan .......3-268370" insert —November 8, 1991 [JP] Japan .......3-321326—.

Signed and Sealed this

Thirtieth Day of July, 1996

Attest:

BRUCE LEHMAN

*Attesting Officer*   *Commissioner of Patents and Trademarks*